United States Patent
Lee et al.

(10) Patent No.: US 11,862,277 B2
(45) Date of Patent: Jan. 2, 2024

(54) DETERIORATION DETECTION DEVICE

(71) Applicant: Samsung Electronics Co., Ltd., Suwon-si (KR)

(72) Inventors: Youngduk Lee, Asan-si (KR); Hyunsung Lim, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/750,317

(22) Filed: May 21, 2022

(65) Prior Publication Data
US 2023/0071135 A1 Mar. 9, 2023

(30) Foreign Application Priority Data

Sep. 3, 2021 (KR) .......................... 10-2021-0117792

(51) Int. Cl.
*G11C 29/50* (2006.01)

(52) U.S. Cl.
CPC .................. *G11C 29/50004* (2013.01); *G11C 2029/5004* (2013.01); *G11C 2029/5006* (2013.01)

(58) Field of Classification Search
CPC ...... G11C 29/50004; G11C 2029/5004; G11C 2029/5006
See application file for complete search history.

(56) References Cited

U.S. PATENT DOCUMENTS

| 6,297,624 | B1 * | 10/2001 | Mitsui ..................... G05F 1/465 323/314 |
| 8,255,850 | B2 | 8/2012 | Jain et al. |
| 8,786,307 | B2 | 7/2014 | Jain |
| 2005/0134360 | A1 | 6/2005 | Aipperspach et al. |
| 2016/0223609 | A1 | 8/2016 | Hwang |
| 2017/0011688 | A1 * | 1/2017 | Kim ........................ G01R 15/09 |
| 2017/0206302 | A1 | 7/2017 | Jo et al. |
| 2018/0175834 | A1 * | 6/2018 | Modi ........................ H03K 7/08 |

FOREIGN PATENT DOCUMENTS

| KR | 1020060111325 A | 10/2006 |
| KR | 1020160094159 A | 8/2016 |
| KR | 1020170087354 A | 7/2017 |

\* cited by examiner

*Primary Examiner* — Mohammed A Bashar
(74) *Attorney, Agent, or Firm* — Muir Patent Law, PLLC

(57) ABSTRACT

A deterioration detection device includes a storage including a first current path and a second current path and configured such that a current is applied to the first current path and the second current path, a storage input control unit configured to compare an internal operating condition of a memory device with a target condition in a first operating mode and to select one of the first current path and the second current path of the storage based on a result of the comparison, and an output unit configured to output an output signal indicated deterioration, accumulated in one of the first current path and the second current path, in a second operating mode.

20 Claims, 12 Drawing Sheets

DETERIORATION DETECTION DEVICE

CROSS-REFERENCE TO RELATED APPLICATION(S)

This U.S. non-provisional patent application claims priority under 35 U.S.C. § 119 to Korean Patent Application No. 10-2021-0117792 filed on Sep. 3, 2021 in the Korean Intellectual Property Office, the disclosure of which is incorporated herein by reference in its entirety.

BACKGROUND

The present disclosure relates to a deterioration detection device.

Application of a high-k metal gate (HKMG) technology may be essential for high-speed operation of a memory device. Transistors of the memory device may be stressed by a bias voltage or a temperature. The stress may reduce a reliability of the transistors. The reliability of the transistors may affect a lifespan of an integrated circuit, for example, a lifespan of a product or a memory device, and may cause the product to be defective. Therefore, the reliability of the transistors should be evaluated during a test.

Negative bias temperature instability (NBTI) or positive bias temperature instability (PBTI) may occur due to stress caused by an external high voltage or a high temperature. Due to the NBTI or PBTI, a threshold voltage of a transistor may be increased and drain current of the transistor may be decreased. Thus, performance of a memory device may be deteriorated.

In a test method according to the related art, propagation delay of an inverter chain or clock characteristics (for example, a frequency or a duty ratio) of a ring oscillator are tested to evaluate NBTI and PBTI. However, the test method according to the related art may be allowed to determine only a total amount of accumulated deterioration. Accordingly, when performance of the memory device is deteriorated, it may be difficult to determine a cause of the deterioration.

SUMMARY

Example embodiments provide a deterioration detection device applying current to a selected current path, among current paths of a storage, and detecting deterioration accumulated in the selected current path when an operating condition in a memory device is outside of an allowable operating range of the memory device.

According to an example embodiment, a deterioration detection device includes a storage including a first current path and a second current path and configured such that a current is applied to the first current path or the second current path, a storage input control unit configured to compare an internal operating condition of a memory device with a target condition in a first operating mode and to select one of the first current path and the second current path of the storage based on a result of the comparison, and an output unit configured to output an output signal indicated deterioration, accumulated in one of the first current path and the second current path, in a second operating mode.

According to an example embodiment, a deterioration detection device includes a mode selector configured to output a mode selection signal setting an operating mode of the deterioration detection device to a first operating mode or a second operating mode in response to a first external command, a comparator configured to receive an internal operating condition of a memory device and a target condition in the first operating mode and to compare the internal operating condition with the target condition to output a result of the comparison as a first current path selection signal, a storage including a first current path and a second current path, and configured to select one of the first current path and the second current path in the first operating mode in response to the first current path selection signal and configured such that a current is applied to the selected current path, and a delay detection unit configured to detect deterioration accumulated in the selected current path.

According to an example embodiment, a deterioration detection device includes a plurality of storages, each of the plurality of storages including a first current path and a second current path and being configured such that a current is applied to the first current path and the second current path in a first operating mode, a plurality of storage input control units, each of the plurality of storage input control units configured to select a current path of each of the plurality of storages, to which the current is to be applied, among the first current path and the second current path, in the first operating mode, a storage output control unit configured to select a storage, of which deterioration is to be measured, among the plurality of storages, in a second operating mode, and a delay detection unit configured to detect deterioration accumulated in the current path of the selected storage in the second operating mode.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
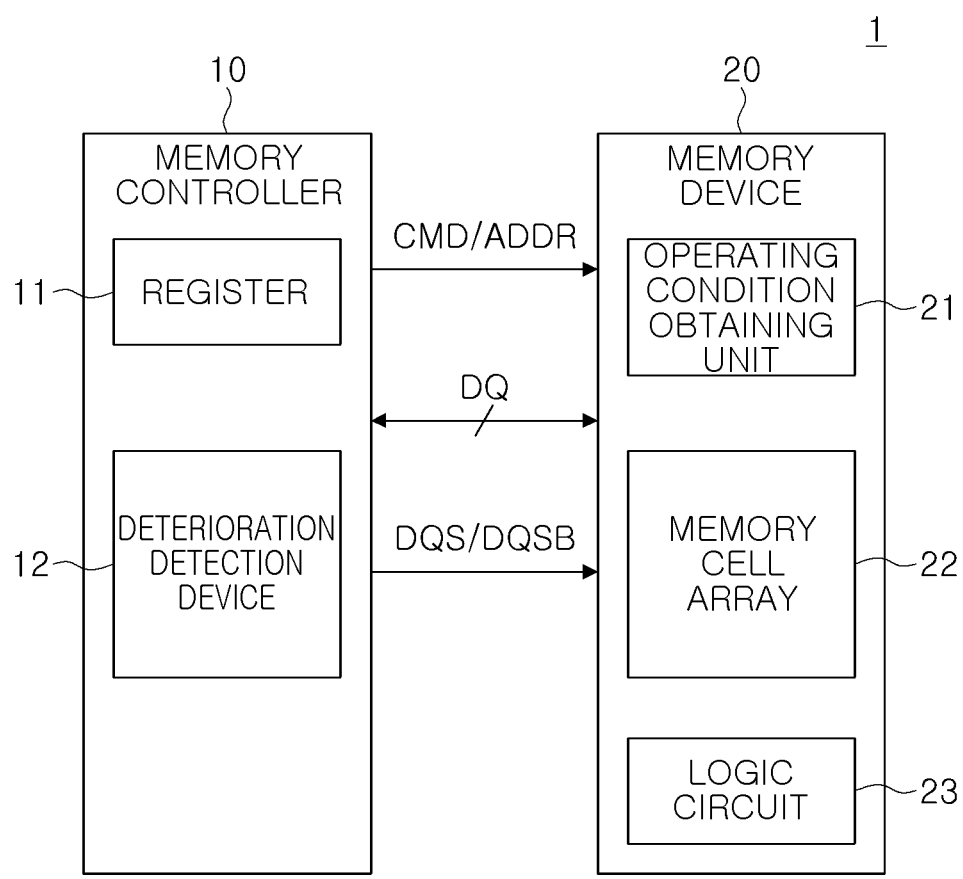
FIG. 1 is a block diagram of a memory system according to an example embodiment.

FIG. 1 is a block diagram of a memory system according to an example embodiment.

Referring to FIG. 1, a memory system 1 may include a memory controller 10 and a memory device 20 as a semiconductor device. The memory controller 10 may apply a command and an address through a command/address bus CMD/ADDR to the memory device 20. The memory controller 10 may receive read data from the memory device 20 through a data bus DQ, or may provide write data to the memory device 20 through the data bus DQ.

A data strobe signal DQS and a complementary data strobe signal DQSB may be data strobe signals having opposite phases provided for data output strobe. The memory controller 10 may provide the data strobe signal DQS and the complementary data strobe signal DQSB in the form of differential signals.

The memory device 20 may be a volatile memory device such as a dynamic random access memory (DRAM), a double data rate 4 (DDR4) synchronous DRAM (SDRAM), or a DDR5 SDRAM including volatile memory cells, but may also be a nonvolatile memory device such as a phase-change RAM (PRAM), a magnetoresistive RAM (MRAM), a ferroelectric RAM (FeRAM) or a resistive RAM (RRAM). The memory device 20 may include an operating condition obtaining unit 21, a memory cell array 22, and a logic circuit 23. The memory device 20 may read data from or write data to the memory cell array 22 under the control of the logic circuit 23. As used herein, a "unit" may refer to a "circuit." The operating condition obtaining unit 21 may output an internal operating condition. The internal operating condition may include an internal temperature (or an operating temperature) of the memory device 20, a power supply voltage VDD of the memory device 20, an AC parameter of the memory device 20, and the like. The AC parameter may include a tRC parameter, a tRCD parameter, a tWR parameter, a tRP parameter, a tRRD parameter, and the like. The tRC parameter represents time between an active command and a next active command. The tRCD parameter represents time between application of a/RAS signal and application of the/CAS signal, and refers to time between a row active command and a column active command. The tWR parameter represents time required to write data to a memory cell after a wordline is enabled. The tRP parameter represents time required to precharge a bitline to prepare for a next active command after tWR time. The tRRD parameter represents time between a row active command and a row active command, and refers to row active-to-row active time between different banks.

The memory controller 10 may include a register 11 and a deterioration detection device 12. A target condition may be previously stored in the register 11. The target condition may refer to an allowable operating range of a product (e.g., a memory device). The deterioration detection device 12 may receive the internal operating condition from the operating condition obtaining unit 21, and may receive the target condition from the register 11. The deterioration detection device 12 may include a storage. The deterioration detection device 12 may select a current path of the storage based on the internal operating condition and the target condition, and may apply current to the selected current path. When current flows through the selected current path, threshold voltages of transistors included in the selected current path may be increased. Accordingly, deterioration may be accumulated in the selected current path. The degree of deterioration of the selected current path may be detected to selectively detect the accumulated deterioration.

A high-speed operation of 14 Gbps or more may increase leakage current, and thus, temperature of a PN junction may be increased. An increase in the temperature of the PN junction may cause unintended BTI, and may deteriorate performance of a memory device. Therefore, heat generation control during the high-speed operation may act as an important factor for controlling deterioration. In addition, a high voltage used to suppress infant mortality (or, early failure) is a major factor accelerating deterioration of the PBTI in a high-k metal gate (HKMG) device. For example, memory performance may be deteriorated due to unintended deterioration caused by excessive use conditions rather than the initial mortality of the device itself.

In general, a deterioration detection device using a delay chain may apply current through a single current path and may detect the degree of deterioration of the current path to detect a total amount of deterioration accumulated in the current path. Accordingly, when performance of a chip is deteriorated, it may be difficult to determine a cause of unintended deterioration.

The deterioration detection device according to an example embodiment may select a current path of a storage and may apply current to the selected current path when an internal operating condition is outside of an allowable operating range of a product. The degree of deterioration of the storage may be detected to selectively detect deterioration accumulated in the storage. Accordingly, the deterioration detection device may rapidly analyze an abnormal operation.

In addition, the deterioration detection device according to an example embodiment may selects a storage, may select a current path of the selected storage, and may apply current the selected current path of the selected storage when an internal operating condition is outside of an allowable operating range of a product. The degree of deterioration of the selected storage may be detected to selectively detect deterioration accumulated in the storage. Accordingly, the deterioration detection device may analyze a cause of abnormal operation.

Figure 2:
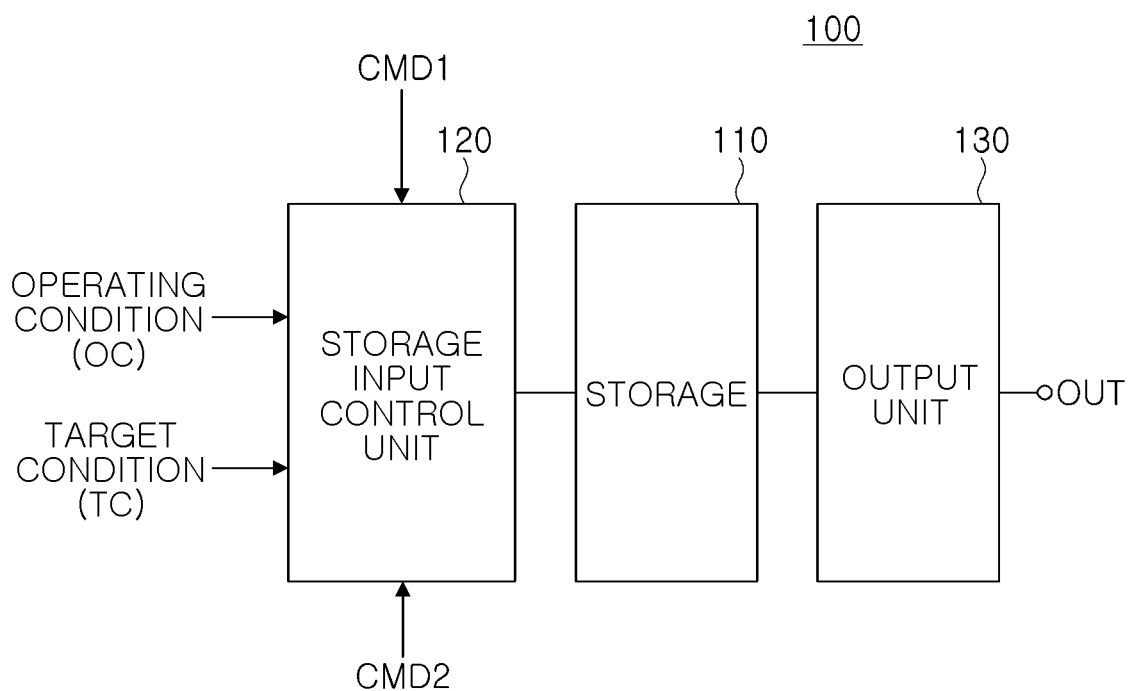
FIG. 2 is a schematic block diagram of a deterioration detection device according to an example embodiment.
Figure 3:
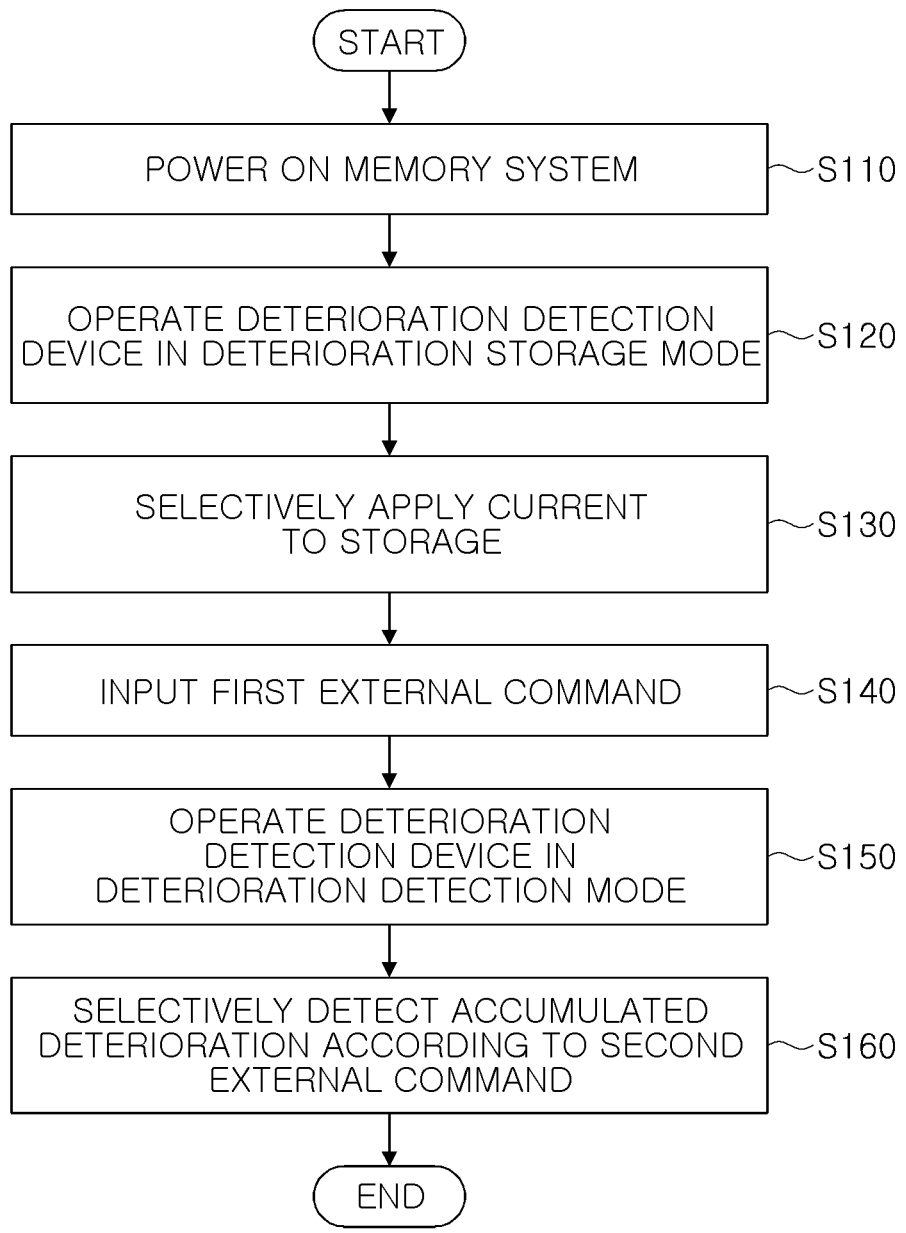
FIG. 3 is a flowchart illustrating an operation of a deterioration detection device according to an example embodiment.

FIG. 2 is a schematic block diagram of a deterioration detection device according to an example embodiment, and FIG. 3 is a flowchart illustrating an operation of a deterioration detection device according to an example embodiment.

Referring to FIG. 2, a deterioration detection device 100 may include a storage 110, a storage input control unit 120, and an output unit 130. The deterioration detection device 100 may operate in a first operating mode, in which stress is applied to the storage 110, or a second operating mode, in which deterioration accumulated in the storage 110 is detected, according to control of the storage input control unit 120.

The storage 110 may be a nonvolatile memory and may include one of, for example, a complementary metal-oxide-semiconductor (CMOS) inverter chain and a fuse. For example, if the storage 110 is deteriorated once a performance of the storage 110 may be maintained in a deterioration state, thus the storage 110 may refer to as a nonvolatile memory. The storage 110 may include a first current path and a second current path. Current may be applied to the first current path and the second current path.

The storage input control unit 120 may compare an internal operating condition OC with a target condition TC in the first operating mode. According to a result of the comparison, the storage input control unit 120 may select one of the first current path and the second current path of the storage 110. For example, the storage input control unit 120 may operate in response to a first external command CMD1 or a second external command CMD2.

The output unit 130 may output an output signal indicated deterioration, accumulated in one of the first current path and the second current path of the storage 110, in the second operating mode.

Referring to FIGS. 1 to 3 together, when the memory system is powered on in operation S110, the deterioration detection device 100 may operate in the first operating mode in operation S120. For example, the deterioration detection device 100 may operate in the first operating mode during a normal operation of the memory device. The first operating mode may be referred to as a current application mode or a deterioration storage mode.

In the first operating mode, the deterioration detection device 100 may selectively apply current to the storage 110 in operation S130. For example, the storage input control unit 120 may compare the internal operating condition OC of a memory device with the target condition TC in the first operating mode, and may select one of the first current path and the second current of the storage 110 according to a result of the comparison. Current may be applied to the selected current path. The internal operating condition OC of the memory device may include one of an internal temperature (or an operating temperature), an internal power supply voltage, and an internal AC parameter of the memory device. In example embodiments, if the internal operating condition OC is the internal temperature of a memory device and the target condition TC is an allowable operating temperature range of the product (e.g., a memory device), the storage input control unit 120 may determine whether the internal temperature of the memory device is outside of the allowable operating temperature range of the product. For example, when the internal temperature of the memory device is outside of the allowable operating temperature range of the product, the storage input control unit 120 may select the first current path of the storage 110. Accordingly, the deterioration detection device 100 may apply current to the first current path of the storage 110 under a high-temperature condition above the allowable operating temperature range. In example embodiments, if the internal operating condition OC is a power supply voltage of the memory device and the target condition TC is an allowable operating voltage range of the memory device, the storage input control unit 120 may determine whether the power supply voltage of the memory device is outside of the allowable operating power range of the memory device. For example, when the power supply voltage of the memory device is outside of the allowable operating power range of the memory device, the storage input control unit 120 may select the first current path of the storage 110. Accordingly, the deterioration detection device 100 may apply a current to the first current path of the storage 110 under a high voltage condition above the allowable operating power range.

In response to the first external command CMD1 setting an operating mode of the deterioration detection device 100 in operation S140, the deterioration detection device 100 may operate in the second operating mode in operation S150. The second operating mode may be referred to as a deterioration detection mode. In example embodiments, the storage input control unit 120 may receive the first external command CMD1 before performing the operation S120. In this case, the deterioration detection device 100 may operate in the first operating mode in response to the first external command CMD1 setting the first operating mode.

In the second operating mode, the deterioration detection device 100 may selectively detect deterioration accumulated in the storage 110 in response to the second external command CMD2 selecting a current path of the storage 110 in operation S160. For example, the storage input control unit 120 may select one of the first current path and the second current path of the storage 110 in response to the second external command CMD2. The output unit 130 may detect the deterioration accumulated in the selected current path, and may output an output signal indicated the deterioration through an output terminal OUT. For example, the output signal of the output unit 130 may represent as an amount of delay time based on the degree of deterioration. Accordingly, the deterioration detection device 100 may selectively detect the accumulated deterioration under a specific condition.

The deterioration detection device 100 according to an example embodiment may apply a current to a selected current path, among current paths of the storage, when the internal operating condition is outside of the allowable operating range (e.g., a target condition) of the product. The deterioration detection device 100 may detect the degree of deterioration of the selected current path to selectively detect the deterioration accumulated in the storage. Accordingly, the deterioration detection device 100 may rapidly analyze an abnormal operation.

Figure 4:
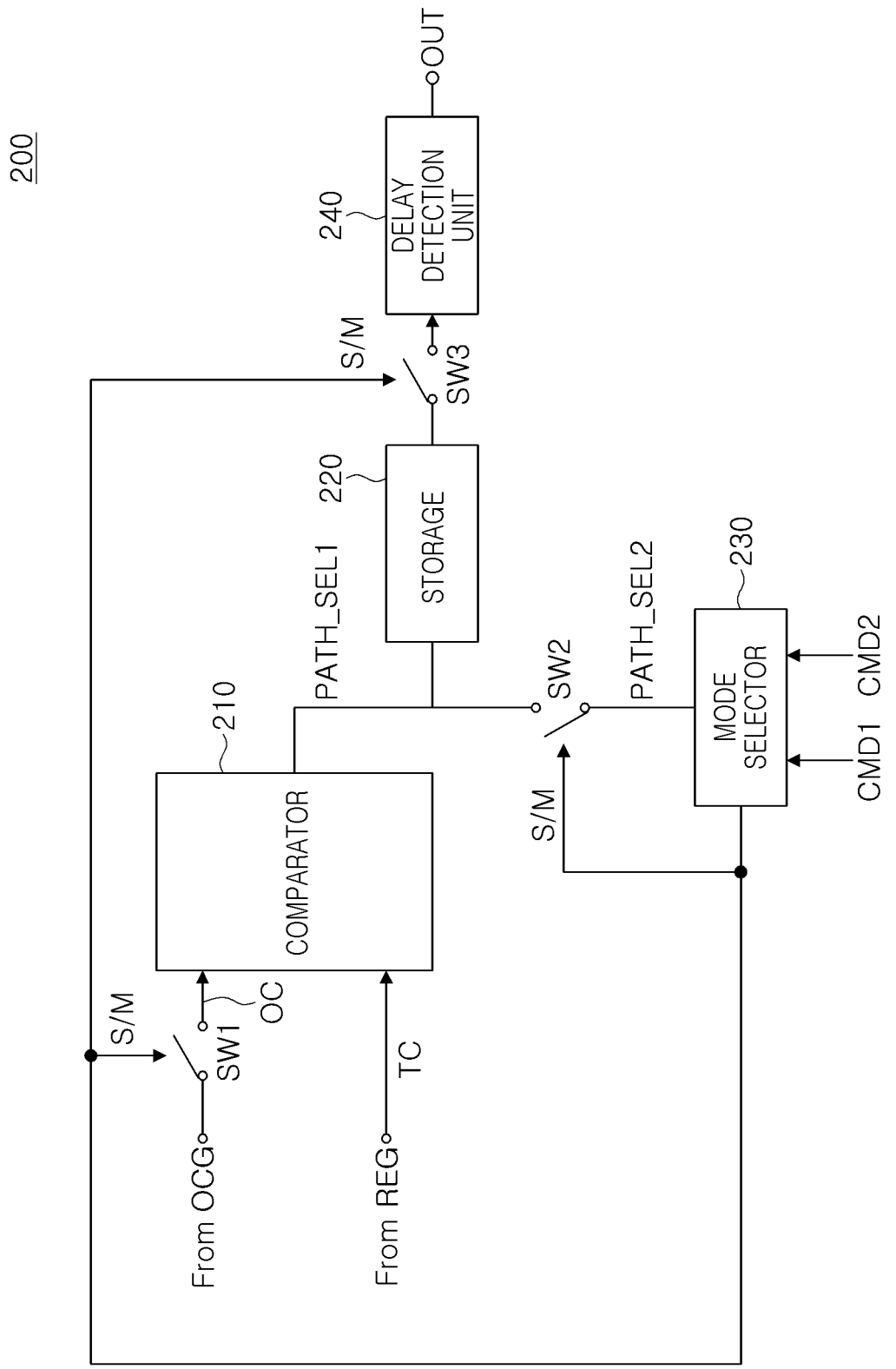
FIG. 4 is a diagram illustrating a detailed example of a deterioration detection device according to an example embodiment.

FIG. 4 is a diagram illustrating a detailed example of a deterioration detection device according to an example embodiment.

Referring to FIG. 4, a deterioration detection device 200 may include a first switch SW1, a comparator 210, a storage 220, a mode selector 230, a second switch SW2, a third switch SW3, a delay detection unit 240, and an output terminal OUT. The comparator 210 and the mode selector 230 may be referred to as a storage input control unit. The comparator 210 and the mode selector 230 may correspond to the storage input control unit of FIG. 2. The storage 220 and the delay detection unit 240 may respectively correspond to the storage 110 and the output unit 130 of FIG. 2.

The comparator 210 may receive an internal operating condition OC of a memory device from an operating condition obtaining unit OCG in the memory device and may receive a target condition TC from a register REG. The operating condition obtaining unit OCG and the register REG may respectively correspond to the operating condition obtaining unit 21 and the register 11 of FIG. 1. The first switch SW1 may be connected between the operating condition obtaining unit OCG and the comparator 210, and the first switch SW1 may control an input of the internal operating condition to the comparator 210.

The second switch SW2 may be connected between the comparator 210 and the mode selector 230, and the third switch SW3 may be connected between the storage 220 and the delay detection unit 240.

The mode selector 230 may output a mode selection signal S/M for setting an operating mode of the deterioration detection device 200 to the first operating mode or the second operating mode in response to a first external command CMD1. For example, the mode selector 230 may set the operating mode of the deterioration detection device 200 to the first operating mode during a normal operation of a memory device. Also, the mode selector 230 may set the operating mode of the deterioration detection device 200 to the second operating mode in response to the first external command CMD1 from a user.

The mode selection signal S/M may control turn-on and turn-off operations of the first switch SW1, the second switch SW2, and the third switch SW3.

In the first operating mode, the comparator 210 may receive the internal operating condition OC from the operating condition obtaining unit OCG and may receive the target condition TC from the register REG. The comparator 210 may compare the internal operating condition OC with the target condition TC, and may output a result of the comparison as a first current path selection signal PATH_SEL1. In some examples, the first current path selection signal PATH_SEL1 may have a logic low level L or a logic high level H based on the result of the comparison. In some examples, the first current path selection signal PATH_SEL1 may transition from the high level H to the logic low level L, or may transition from the logic low level L to the logic high level H.

The internal operating condition OC may include an internal temperature of a memory device, an internal power voltage VDD of the memory device, an internal AC parameter of the memory device, and the like.

The target condition TC may be previously stored in the register REG, and may refer to an allowable operating range of a product. For example, the target condition TC may include an allowable operating temperature range of the product, an allowable operating voltage range of the product, an allowable operation AC parameter range of the product, and the like.

The storage 220 may include a first current path and a second current path. In the first operating mode, the storage 220 may select one of the first current path and the second current path in response to the first current path selection signal PATH_SEL1. A current may be applied to the selected current path.

For example, when the internal operating condition OC is an internal temperature of the memory device and the target condition TC is an allowable operating temperature range of the product, the comparator 210 may determine whether the internal temperature of the memory device is outside of the allowable operating temperature range of the product. When the internal temperature of the memory device is outside of the allowable operating temperature range of the product, the comparator 210 may select the first current path of the storage 220 in response to the first current path selection signal PATH_SEL1. For example, the deterioration detection device 200 may apply a current to the first current path of the storage 220 under a high-temperature condition above the allowable operating temperature range.

In example embodiments, if the storage 220 includes an anti-fuse the deterioration detection device 200 may apply a current to a first current path of the anti-fuse under the high-temperature condition such that the anti-fuse may be cut-off. Alternatively, the deterioration detection device 200 may apply a current to a second current path of the anti-fuse under a temperature condition satisfying the target condition such that the anti-fuse may not be cut-off.

The mode selector 230 may output a second current path selection signal PATH_SEL2 in response to a second external command CMD2. In some examples, the second current path selection signal PATH_SEL2 may have a logic low level L or a logic high level H in response to the second external command CMD2. In some examples, the second current path selection signal PATH_SEL2 may transition from the high level H to the logic low level L, or may transition from the logic low level L to the logic high level H in response to the second external command CMD2.

In the second operating mode, one of the first current path and the second current path of the storage 220 may be selected in response to the second current path selection signal PATH_SEL2. In some examples, when the second current path selection signal PATH_SEL2 has the logic low level L the first current path of the storage 220 may be selected, and when the second current path selection signal PATH_SEL2 has the logic high level H the second current path of the storage 220 may be selected. In some examples, when the second current path selection signal PATH_SEL2 transitions from the high level H to the logic low level L the first current path of the storage 220 may be selected, and when the second current path selection signal PATH_SEL2 transitions from the logic low level L to the logic high level H the second current path of the storage 220 may be selected. The delay detection unit 240 may detect deterioration accumulated in the selected current path. For example, the delay detection unit 240 may determine whether a signal passes through the selected current path of the storage 220 for a predetermined time period to detect the deterioration accumulated in the selected current path. The predetermined time period may refer to a time period during which a current may pass through the storage 220.

The delay detection unit 240 may output an output signal indicated the accumulated deterioration through an output terminal OUT of the delay detection unit 240.

The delay detection unit 240 may adjust the predetermined time period to detect the amount of the accumulated deterioration.

The deterioration detection device 200 according to an example embodiment may apply a current to a selected current path, among current paths of the storage, and may selectively detect deterioration accumulated in the storage when the internal operating condition is outside of the allowable operating range of the product.

FIGS. 5 to 9 are diagrams illustrating a method of operating a deterioration detection device according to an operating mode of the deterioration detection device. In FIGS. 5 to 9, an embodiment in which the operating condition obtaining unit is a temperature sensor and the storage is a delay chain or a CMOS inverter chain will be described, but the inventive concept is not limited thereto.

Figure 5:
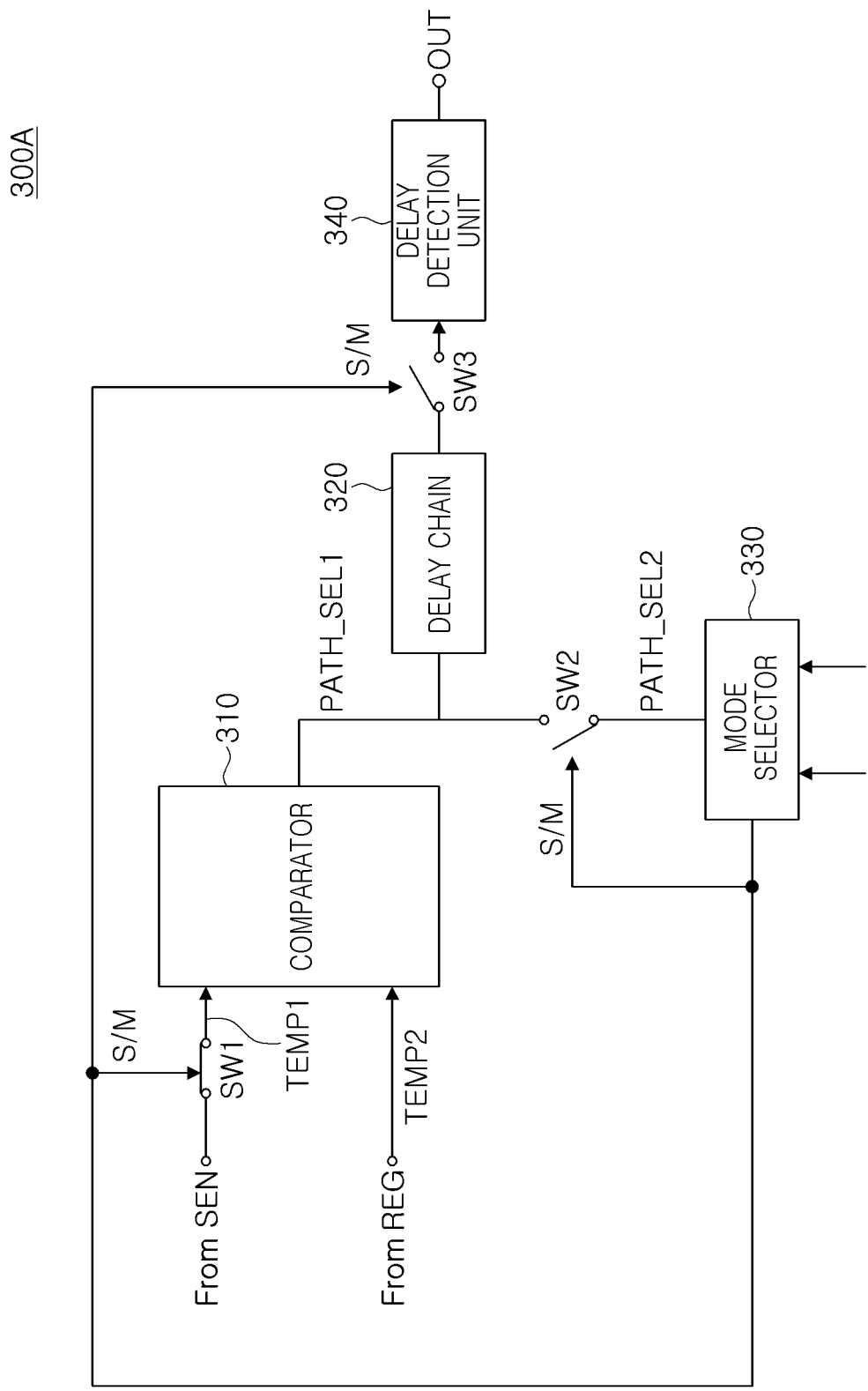
FIG. 5 is a diagram illustrating a deterioration detection device in a current application mode according to an example embodiment.
Figure 6:
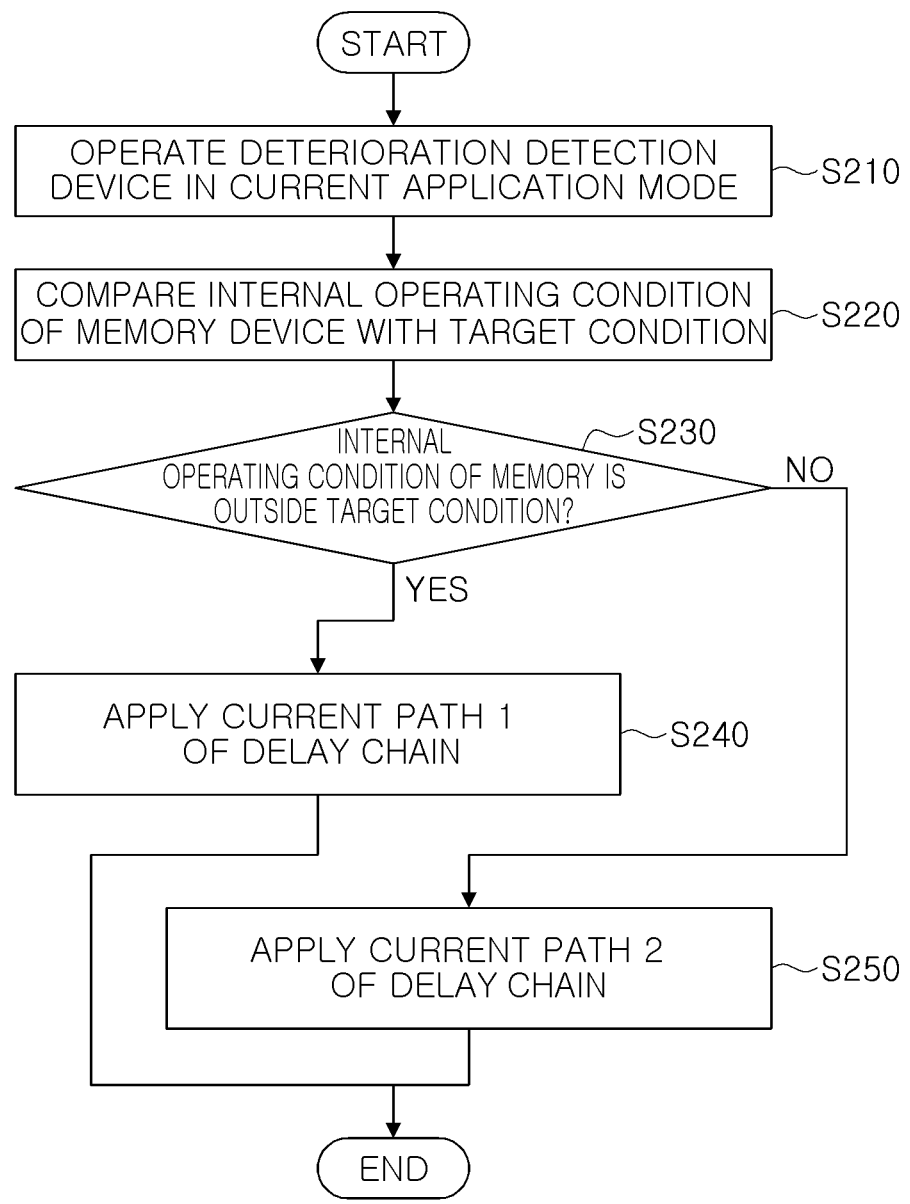
FIG. 6 is a flowchart illustrating a method of operating a deterioration detection device according to an example embodiment in a current application mode.

FIG. 5 is a diagram illustrating a deterioration detection device in a current application mode according to an example embodiment, and FIG. 6 is a flowchart illustrating a method of operating a deterioration detection device according to an example embodiment in a current application mode.

Referring to FIG. 5, a deterioration detection device 300A may include a first switch SW1, a comparator 310, a delay chain 320, a mode selector 330, a second switch SW2, a third switch SW3, a delay detection unit 340, and an output terminal OUT. The comparator 310 and the mode selector 330 may correspond to the storage input control unit of FIG. 2. The delay chain 320 and the delay detection unit 340 may respectively correspond to the storage 110 and the output unit 130 of FIG. 2.

Referring to FIGS. 5 and 6 together, during a normal operation of a memory device, the mode selector 330 may output a mode selection signal S/M for setting an operating mode of the deterioration detection device 300A to a first operating mode (e.g., the current application mode). In operation S210, the deterioration detection device 300A may operate in the first operating mode in response to the mode selection signal S/M.

The first switch SW1 may be turned on in response to the mode selection signal S/M. In operation S220, when the first switch SW1 is turned on, the comparator 310 may compare an internal operating condition of a memory device with a target condition. For example, the comparator 310 may receive an internal temperature TEMP1 of the memory device from a temperature sensor SEN and a target temperature TEMP2 from the register REG. The comparator 310 may compare the internal temperature TEMP1 with the target temperature TEMP2.

As a result of the comparison, when the internal operating condition is outside of the target condition (YES) in operation S230, a current may be applied to a first current path PATH1 (in FIG. 7) of the delay chain 320 in operation S240. For example, when the internal temperature TEMP1 of the memory device is outside of the target temperature TEMP2, the comparator 310 may select the first current path PATH1 of the delay chain 320. For example, when a high-temperature condition above the allowable operating temperature range is satisfied, the deterioration detection device 300A may apply a current to the first current path PATH1 of the delay chain 320.

As a result of the comparison, when the internal operating condition satisfies the target condition (NO) in operation S230, a current may be applied to a second current path PATH2 (in FIG. 7) of the delay chain 320 in operation S250. For example, when the internal temperature TEMP1 of the memory device satisfies the target temperature TEMP2, the comparator 310 may select the second current path PATH2 of the delay chain 320. For example, when the internal temperature of the memory device satisfies the allowable operating range of the product, the deterioration detection device 300A may apply a current to the second current path PATH2 of the delay chain 320.

Figure 7:
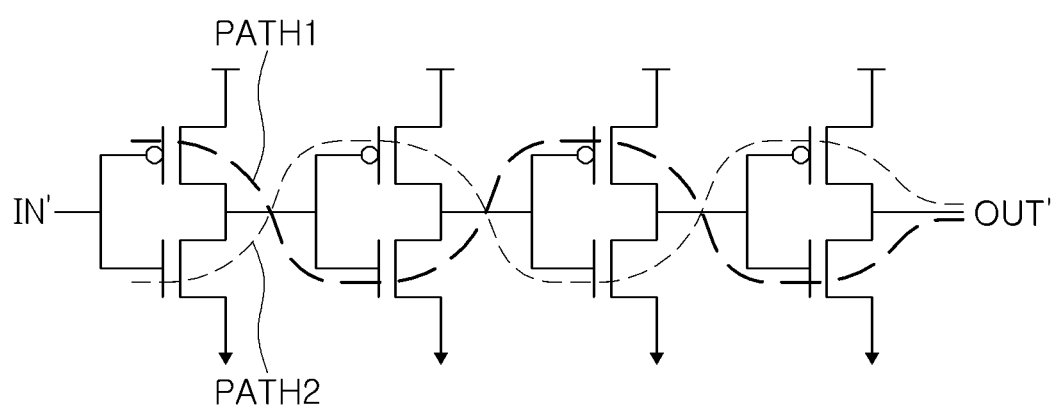
FIG. 7 is a circuit diagram illustrating a delay chain according to an example embodiment.

FIG. 7 is a circuit diagram illustrating a delay chain according to an example embodiment.

Referring to FIG. 7, the delay chain 320 may be a CMOS inverter chain. As illustrated in FIG. 7, in the CMOS inverter chain, a plurality of inverters may be connected in series, and each of the plurality of inverters may include a p-type metal oxide semiconductor (PMOS) transistor and an n-type metal oxide semiconductor (NMOS) transistor. When an input signal IN' of the delay chain 320 has a logic low level L, a first current path PATH1 of the delay chain 320 may be selected. For example, when the internal temperature TEMP1 of the memory device is outside of the target temperature TEMP2, the comparator 310 may output a signal having the logic low level L, or transitioning from the logic high level H to the logic low level L. When the input signal IN' of the delay chain 320 has a logic high level H, a second current path PATH2 of the delay chain 320 may be selected. For example, when the internal temperature TEMP1 of the memory device satisfies the target temperature TEMP2, the comparator 310 may output a signal having the logic high level H, or transitioning from the logic low level L to the logic high level H. However, the inventive concept is not limited to this example, and in an embodiment, the comparator 310 may output a signal having the logic high level H or transitioning from the logic low level L to the logic high level H when the internal temperature TEMP1 of the memory device is outside of the target temperature TEMP2, and the comparator 310 may output a signal having the logic low level L or transitioning from the logic high level H to the logic low level L when the internal temperature TEMP1 of the memory device satisfies the target temperature TEMP2.

When the first current path PATH1 is selected, a threshold voltage of each of transistors included in the first current path PATH1 may be increased. Accordingly, deterioration of the delay chain 320 may be accumulated in the first current path PATH1. For example, when the amount of deterioration accumulated in the first current path PATH1 is increased, the delay chain 320 may output an output signal OUT' having the logic low level L at a second time point T2 longer than a first time point T1 in response to the input signal IN' having the logic low level L. Herein, the first time point T1 may be a predetermined delay time. For example, the delay chain 320 without deterioration may output the output signal OUT' having the logic low level L at the first time point T1 in response to the input signal IN' having a logic low level L. When the second current path PATH2 is selected, a threshold voltage of each of transistors included in the second current path PATH2 may be increased. Accordingly, deterioration of the delay chain 320 may be accumulated in the second current path PATH2. For example, when the amount of deterioration accumulated in the second current path PATH2 is increased, the delay chain 320 may output the output signal OUT' having the logic high level H at a fourth time point T4 longer than a third time point T3 in response to the input signal IN' having a logic high level H. Herein, the third time point T3 may be a predetermined delay time. For example, the delay chain 320 without deterioration may output the output signal OUT' having the logic high level H at the third time point T3 in response to the input signal IN' having a logic high level H. The first time point T1 and the third time point T3 may be similar to or the same as each other, and the input signals IN' having the logic low level L and logic high level H may be applied at the same time. For example, when a high-temperature condition above the allowable operating temperature range continues, the amount of deterioration accumulated in the first current path PATH1 may be increased.

In the deterioration detection device according to an example embodiment, deterioration may be accumulated in a specific current path of a storage under a specific condition.

Returning to FIG. 5, each of the second switch SW2 and the third switch SW3 may be turned off in the first operating mode. For example, in the first operating mode, the deterioration detection device 300A may not detect the deterioration accumulated in the delay chain 320.

Figure 8:
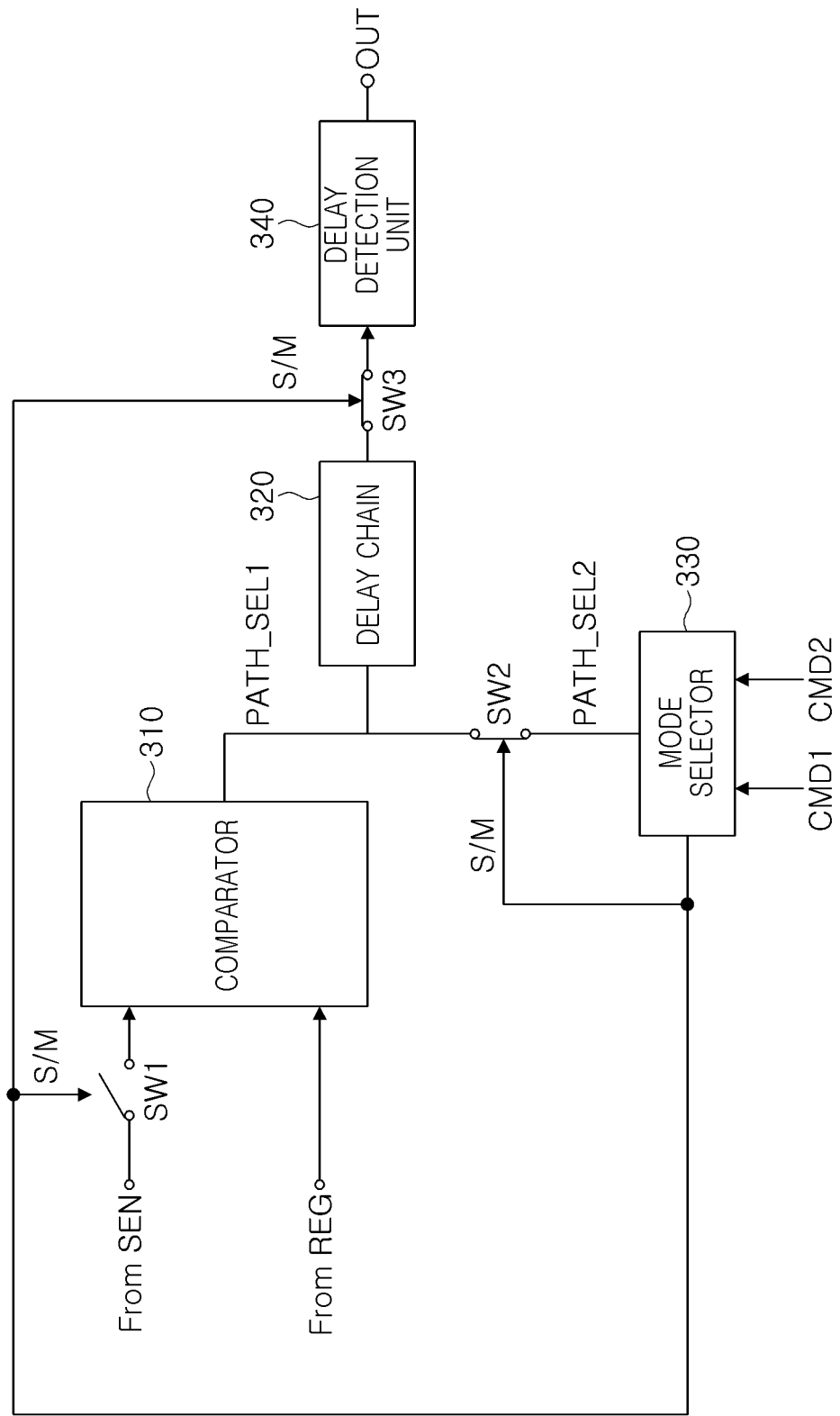
FIG. 8 is a diagram illustrating a deterioration detection device according to an example embodiment in a deterioration detection mode.
Figure 9:
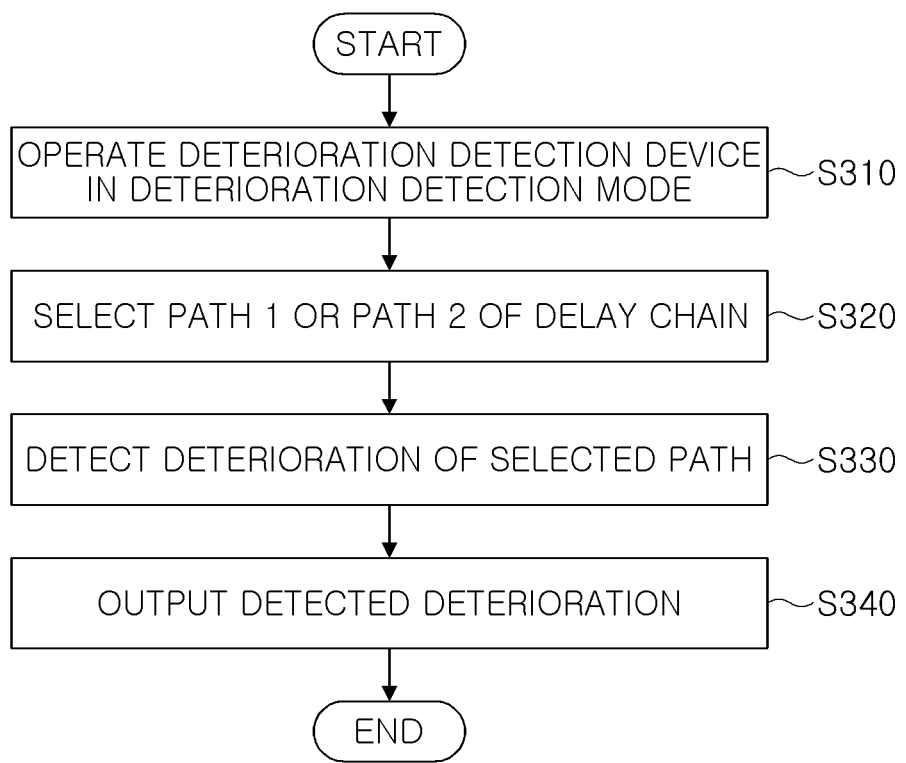
FIG. 9 is a flowchart illustrating a method of operating a deterioration detection device according to an example embodiment in a deterioration detection mode.

FIG. 8 is a diagram illustrating a deterioration detection device according to an example embodiment in a deterioration detection mode, and FIG. 9 is a flowchart illustrating a method of operating a deterioration detection device according to an example embodiment in a deterioration detection mode.

Referring to FIG. 8, a deterioration detection device 300B may include a first switch SW1, a comparator 310, a delay chain 320, a mode selector 330, a second switch SW2, and a third switch SW3, a delay detection unit 340, and an output terminal OUT.

Referring to FIGS. 8 and 9 together, the mode selector 330 may output a mode selection signal S/M for setting an operating mode of the deterioration detection device 300B to a second operating mode in response to a first external command CMD1 from a user. In operation S310, the deterioration detection device 300B may operate in the second operating mode in response to the mode selection signal S/M.

In response to the mode selection signal S/M, the first switch SW1 may be turned off and each of the second switch SW2 and the third switch SW3 may be turned on. When the second switch SW2 is turned on, the comparator 310 may be disabled. For example, the deterioration detection device 300B may detect deterioration, accumulated in the delay chain 320 in response to the second current path selection signal PATH_SEL2 from the mode selector 330, in the second operating mode.

The mode selector 330 may output a second current path selection signal PATH_SEL2 in response to a second external command CMD2. In operation S320, when the second switch SW2 is turned on, one of the first current path and the second current path of the delay chain 320 may be selected in response to the second external command CMD2. For example, when the second current path selection signal PATH_SEL2 has the logic low level L or transitions from the logic high level H to the logic low level L the first current path of the delay chain 320 is selected, and when the second current path selection signal PATH_SEL2 has a logic high level H or transitions from the logic low level L to the logic high level H the second current path of the delay chain 320 is selected.

In operation S330, when the third switch SW3 is turned on, the delay detection unit 340 may detect the deterioration accumulated in the selected current path. For example, the delay detection unit 340 may determine whether a signal passes through the selected current path of the delay chain 320 for a predetermined time period to detect the deterioration accumulated in the selected current path. The predetermined time period refers to a time period during which a current may pass through the delay chain 320.

In operation S340, the delay detection unit 340 may output an output signal indicated the accumulated deterioration through the output terminal OUT of the delay detection unit 340. For example, when a high-temperature condition above the allowable operating temperature range continues, the delay detection unit 340 may output the output signal having the logic low level L on the output terminal OUT of the delay detection unit 340 at a longer time than a predetermined time. Accordingly, the deterioration detection device 300B may detect the accumulated deterioration of the memory device.

The deterioration detection device 300B according to an example embodiment may selectively detect deterioration accumulated in the delay chain.

Figure 10:
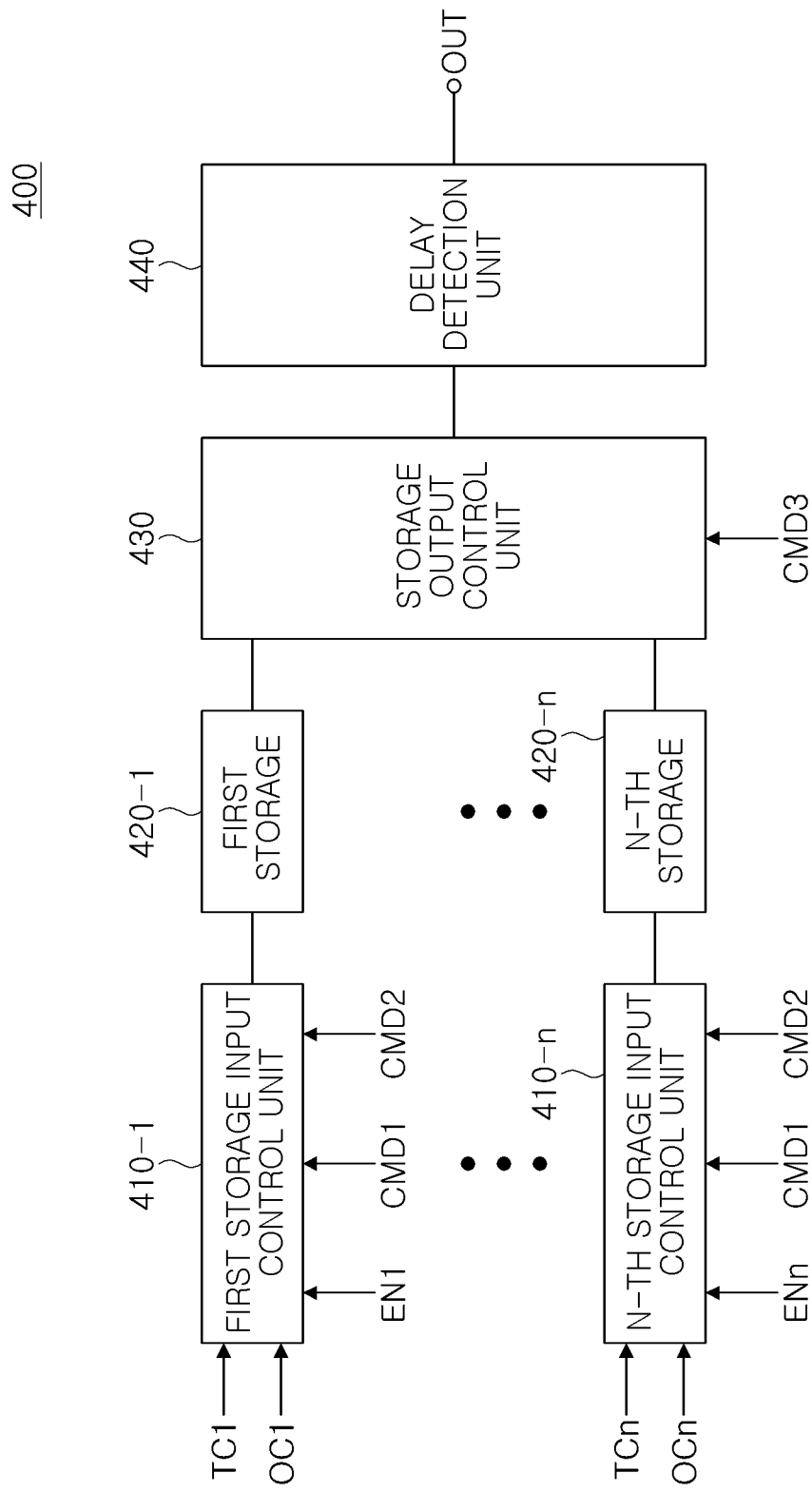
FIG. 10 is a schematic block diagram of a deterioration detection device according to an example embodiment.

FIG. 10 is a schematic block diagram of a deterioration detection device according to an example embodiment.

Referring to FIG. 10, a deterioration detection device 400 may include a plurality of storage input control units 410-1 to 410-n, a plurality of storages 420-1 to 420-n, a storage output control unit 430, a delay detection unit 440, and an output terminal OUT.

Each of the plurality of storages 420-1 to 420-n may include a first current path and a second current path, and a current may be applied to the first current path and the second current path in the first operating mode.

Each of the plurality of storage input control units 410-1 to 410-n may select a current path, to which a current is to be applied, among the first current path and the second current path in the first operating mode. Each of the plurality of storage input control units 410-1 to 410-n may include a mode selector. Each of the mode selectors, included in the plurality of storage input control units 410-1 to 410-n, may be enabled in response to enable signals EN1 to ENn. The storage input control unit including the enabled mode selector may operate while the mode selector is enabled. The mode selector may set an operating mode of the deterioration detection device 400 to a first operating mode or a second operating mode in response to the first external command CMD1.

Each of the plurality of storage input control units 410-1 to 410-n may compare a corresponding one of internal operating conditions OC1 to OCn with a corresponding one of target conditions TC1 to TCn. Each of the plurality of storage input control units 410-1 to 410-n may select a current path, to which a current is to be applied, among the first current path and the second current path based on a result of the comparison.

The internal operating conditions OC1 to OCn and the target conditions TC1 to TCn may be different from each other for each of the plurality of storage input control units 410-1 to 410-n. For example, the first internal operating condition OC1 may be an internal temperature of the memory device, and the n-th internal operating condition OCn of the memory device may be an internal power supply voltage of the memory device. In this case, the first target condition TC1 may be an allowable operating temperature range of a product, and the nth target condition TCn may be an allowable operating power supply voltage range of the product.

The storage output control unit 430 may select a storage, to which a current is to be applied, among the plurality of storages 420-1 to 420-n in the second operating mode. Each of the mode selectors, included in the plurality of storage input control units 410-1 to 410-n, may output a second current path selection signal in response to the second external command CMD2. The storage output control unit 430 may select a current path, to which a current is to be applied, among current paths of each of the plurality of storages 420-1 to 420-n, in response to the second current path selection signal.

The storage output control unit 430 may generate a selection signal in response to a third external command CMD3. The storage output control unit 430 may select a storage, of which deterioration is to be detected, among the plurality of storages 420-1 to 420-n, in response to the selection signal.

The delay detection unit 440 may detect deterioration accumulated in the selected current path of the selected storage in the second operating mode. The delay detection unit 440 may determine whether a signal passes through the current path of the selected storage for a predetermined time period to detect the deterioration accumulated in the current path of the selected storage. The delay detection unit 440 may output the detected deterioration through the output terminal OUT of the delay detection unit 440.

Figure 11:
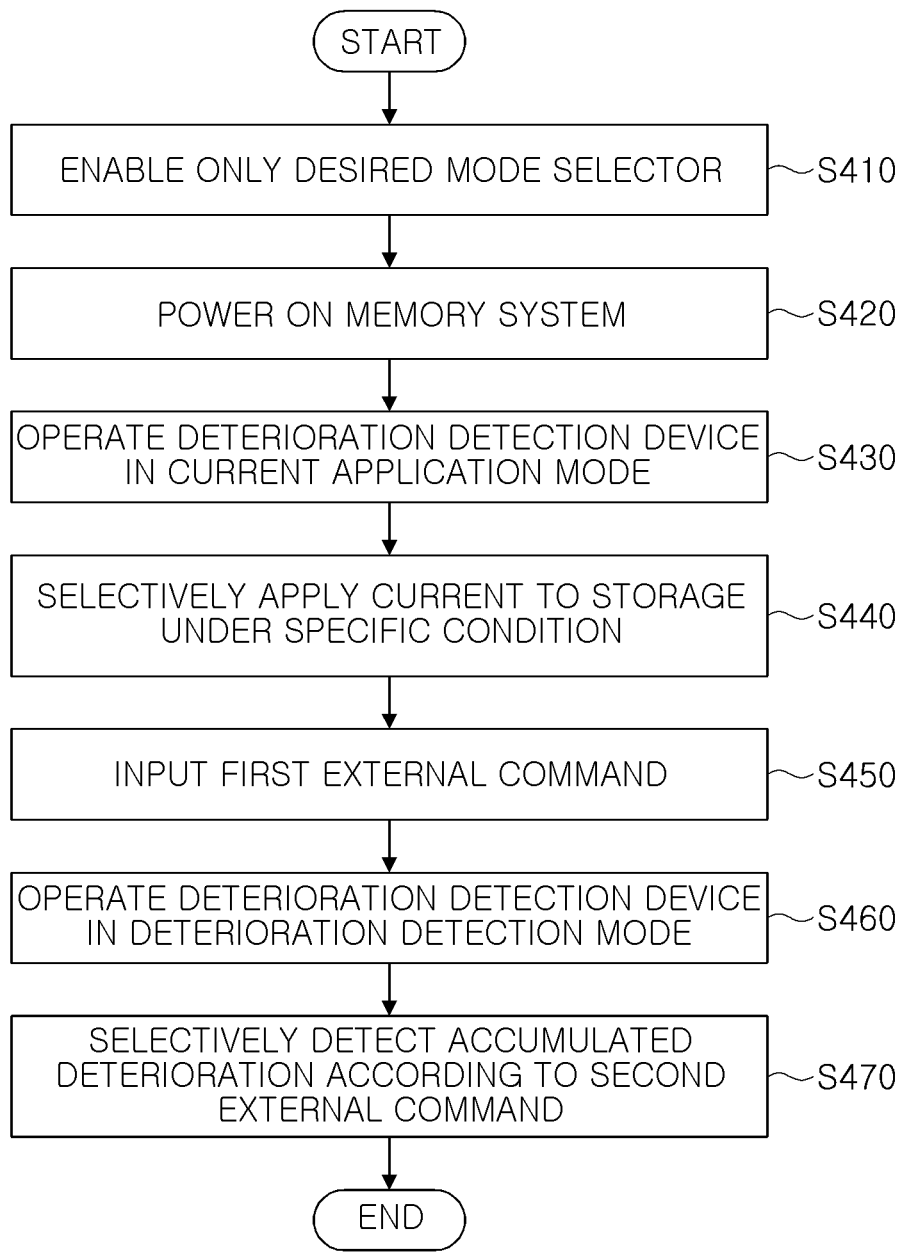
FIG. 11 is a flowchart illustrating an operation of a deterioration detection device according to an example embodiment.

FIG. 11 is a flowchart illustrating an operation of a deterioration detection device according to an example embodiment.

Referring to FIGS. 10 and 11 together, the mode selectors included in the plurality of storage input control units 410-1 to 410-n may be enabled in response to the enable signals EN1 to ENn, respectively. In operation S410, for example, only desired mode selectors may be enabled.

When the memory system is powered on in operation S420, the deterioration detection device 400 may operate in the first operating mode in operation S430. For example, the deterioration detection device 400 may operate in the first operating mode during a normal operation of the memory device. The first operating mode may be referred to as a current application mode.

In operation S440, in the first operating mode, the deterioration detection device 400 may selectively apply current to at least one of the plurality of storages 420-1 to 420-n under a specific condition. For example, each of the plurality of storage input control units 410-1 to 410-n may compare a corresponding one of the internal operating conditions OC1 to OCn with a corresponding one of the target conditions TC1 to TCn. Each of the plurality of storage input control units 410-1 to 410-n may select a current path, to which a current is to be applied, among the first current path and the second current path, based on a result of the comparison. The internal operating conditions OC1 to OCn and the target conditions TC1 to TCn may be different from each other for each of the plurality of storage input control units 410-1 to 410-n.

For example, the first internal operating condition OC1 may be an internal temperature of a memory device, and the n-th internal operating condition OCn may be an internal power supply voltage of the memory device. The mode selector included in the first storage input control unit 410-1 may be enabled, while the mode selector included in the n-th storage input control unit 410-n may be disabled. When the internal temperature OC1 of the memory device is outside of the target temperature TC1, the first storage input control unit 410-1 may select a first current path of the first storage 420-1. Accordingly, the deterioration detection device 400 may apply a current to the first current path of the first storage 420-1 and may not apply a current to the n-th storage 420-n under a high-temperature condition.

According to an example embodiment, a current may be selectively applied to the storage under a specific condition for each of a plurality of degradation factors.

In response to the first external command CMD1 for setting the operating mode of the deterioration detection device 400 in operation S450, the deterioration detection device 400 may operate in the second operating mode in operation S460. The second operating mode may be referred to as a deterioration detection mode.

In operation S470, in the second operating mode, the deterioration detection device 400 may selectively detect deterioration accumulated in one of the plurality of storages 420-1 to 420-n in response to the second external command CMD2 for selecting a current path.

Each of the mode selectors, included in the plurality of storage input control units 410-1 to 410-n, may output a second current path selection signal in response to the second external command CMD2. A current path through which deterioration is to be detected, among current paths of the plurality of storages 420-1 to 420-n, may be selected in response to the second current path selection signal.

The storage output control unit 430 may generate a selection signal in response to the third external command CMD3. The storage output control unit 430 may select a storage, of which deterioration is to be detected, among the plurality of storages 420-1 to 420-n, in response to the selection signal.

The delay detection unit 440 may detect the deterioration accumulated in the selected current path of the storage selected in the second operating mode. The delay detection unit 440 may determine whether a signal passes through the selected current path of the selected storage for a predetermined time period to detect the deterioration accumulated in the selected current path of the selected storage. The delay detection unit 440 may output the detected deterioration through the output terminal OUT.

According to an example embodiment, deterioration satisfying a specific condition may be selectively detected for each of the plurality of deterioration factors. Thus, a cause of the abnormal operation may be analyzed.

Figure 12:
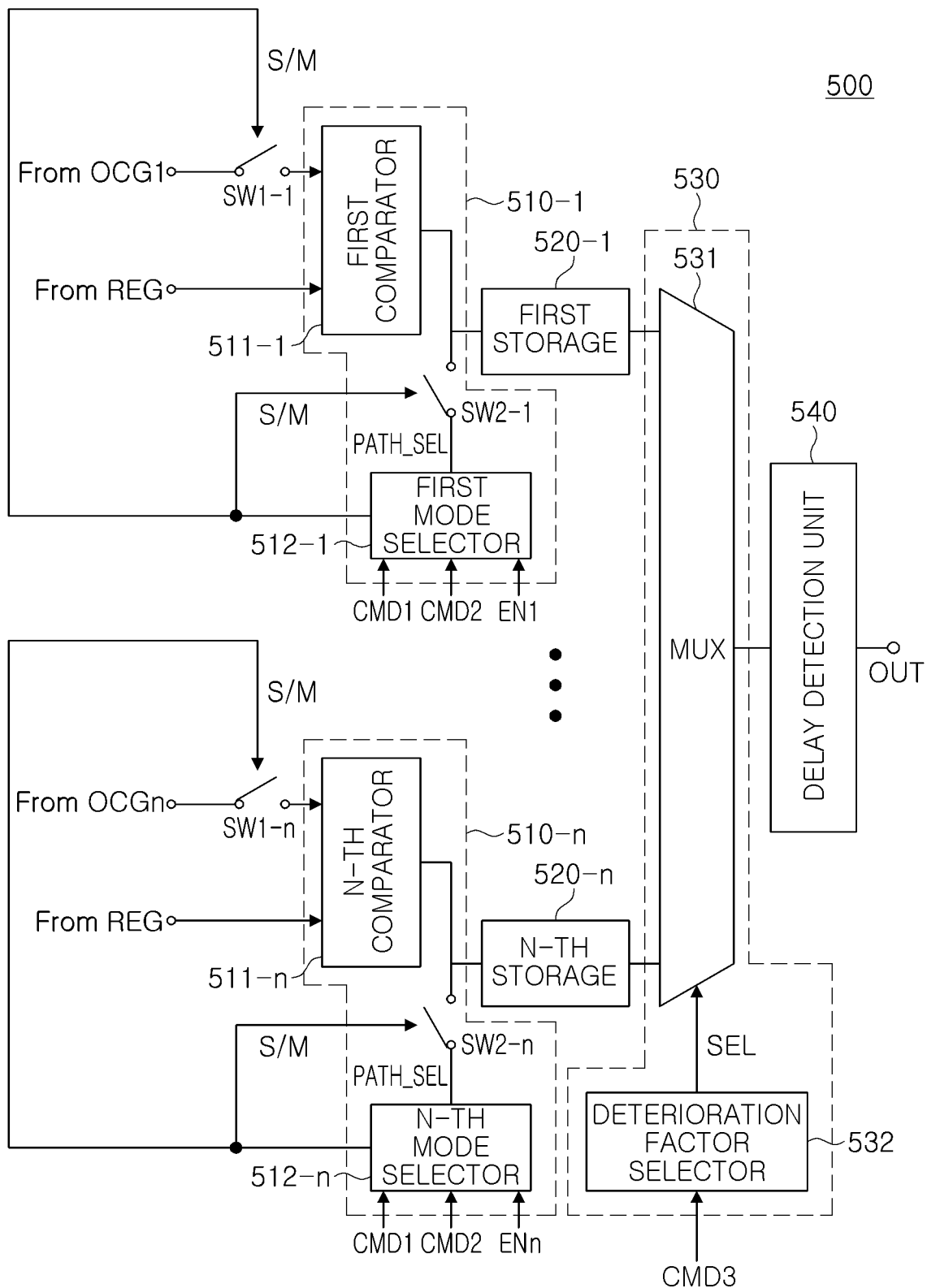
FIG. 12 is a diagram illustrating a detailed example of a deterioration detection device according to an example embodiment.

FIG. 12 is a diagram illustrating a detailed example of a deterioration detection device according to an example embodiment.

Referring to FIG. 12, a deterioration detection device 500 may include a plurality of first switches SW1-1 to SW1-n, a plurality of storage input control units 510-1 to 510-n, and a plurality of storages 520-1 to 520-n, a storage output control unit 530, a delay detection unit 540, and an output terminal OUT.

The plurality of storage input control units 510-1 to 510-n may include comparators 511-1 to 511-n, mode selectors 512-1 to 512-n, and a plurality of second switches SW2-1 to SW2-n, respectively.

Each of the mode selectors 512-1 to 512-n may be enabled in response to the enable signals EN1 to ENn, respectively. For example, only desired mode selectors may be enabled. The storage input control unit including the enabled mode selector may operate while the mode selector is enabled.

When the memory system is powered on, each of the mode selectors 512-1 to 512-n may output a mode selection signal S/M for setting the deterioration detection device 500 to a first operating mode. In response to the mode selection signal S/M, the deterioration detection device 500 may operate in the first operating mode.

The plurality of first switches SW1-1 to SW1-n may be turned on in the first operating mode in response to the mode selection signal S/M. When the plurality of first switches SW1-1 to SW1-n are turned on, each of the comparators 511-1 to 511-n may compare an internal operating condition with a target condition.

As an example, the first comparator 511-1 may receive a first internal operating condition from a first operating condition obtaining unit OCG1 and may receive a first target condition from a register REG. The first comparator 511-1 may compare the first internal operating condition with the first target condition. The n-th comparator 511-n may receive an n-th internal operating condition from an n-th operating condition obtaining unit OCGn and may receive an n-th target condition from the register REG. The n-th comparator 511-n may compare the n-th internal operating condition with the n-th target condition.

In example embodiments, each of the first to n-th internal operating conditions may be different from each other. For example, the first operating condition obtaining unit OCG1 may be a temperature sensor, the first internal operating condition may be an internal temperature of the memory device, and the first target condition may be an allowable operating temperature range of a product. The n-th operating condition obtaining unit OCGn may be a power supply voltage determination unit, the n-th internal operating condition may be an internal power supply voltage of the memory device, and the n-th target condition may be an allowable operating voltage range of the product.

As a result of the comparison, when the internal operating condition is outside of the target condition, current may be applied to the first current path of each of the plurality of storages 520-1 to 520-n.

As an example, when the first internal operating condition is outside of the first target condition, the first comparator 511-1 may select the first current path of the first storage 520-1. When the n-th internal operating condition is outside of the second target condition, the n-th comparator 511-n may select the first current path of the n-th storage 520-n.

As a result of the comparison, when the internal operating condition satisfies the target condition, current may be applied to the second current path of each of the plurality of storages 520-1 to 520-n. As an example, when the first internal operating condition satisfies the first target condition, the first comparator 511-1 may select the second current path of the first storage 520-1. When the n-th internal operating condition satisfies the second target condition, the n-th comparator 511-n may select the second current path of the nth storage 520-n.

For example, current may be applied to the first current path of the first storage 520-1 when a high-temperature condition is satisfied, and may be applied to the first current path of the nth storage **520-*n*** when the high voltage condition is satisfied. Accordingly, the current may be selectively applied to the storage under a specific condition for each of the plurality of degradation factors.

Each of the mode selectors 512-1 to **512-*n* may out a mode selection signal S/M for setting the operating mode of the deterioration detection device 500 to the second operating mode in response to a first external command CMD1 from the user. In response to the mode selection signal S/M, the deterioration detection device 500** may operate in the second operating mode.

In response to the mode selection signal S/M, the plurality of first switches SW1-1 to SW1-*n* may be turned off while the plurality of second switches SW2-1 to SW2-*n* may be turned on. Accordingly, in the second operating mode, the deterioration detection device 500 may detect deterioration accumulated in the plurality of storages 520-1 to **520-*n***.

Each of the mode selectors 512-1 to **512-*n* may output a current path selection signal PATH_SEL in response to a second external command CMD2. In the second operating mode, one of the first current path and the second current path of each of the plurality of storages 520-1 to 520-*n*** may be selected in response to the current path selection signal PATH_SEL.

The storage output control unit 530 may include a multiplexer 531 and a deterioration factor selector 532. The deterioration factor selector 532 may output a selection signal SEL in response to a third external command CMD3 from the user. The multiplexer 531 may select a storage of which deterioration is to be measured, among the plurality of storages 520-1 to **520-*n***, in response to the selection signal SEL.

As an example, when the user inputs the second external command CMD2 and the third external command CMD3 to detect deterioration under a high-temperature condition, the storage output control unit 530 may select the first current path of the first storage unit 520-1.

The delay detection unit 540 may detect the deterioration accumulated in the selected current path of the selected storage. For example, the delay detection unit 540 may determine whether a signal passes through the selected current path of the selected storage for a predetermined time period to detect the deterioration accumulated in the selected current path of the selected storage. The predetermined time period may refer to a time during which current may pass through the storage.

The delay detection unit 540 may output an output signal indicated the accumulated deterioration through the output terminal OUT of the delay detection unit 540.

The delay detection unit 540 may adjust the predetermined time to detect the amount of the accumulated deterioration.

The deterioration detection device 500 according to an example embodiment may selectively apply current to the storage and may selectively detect the accumulated deterioration when the internal operating condition is outside of an allowable operating range of a product. Accordingly, an abnormal operation may be rapidly analyzed.

In example embodiments, each of the deterioration detection devices 100, 200, 300A, 300B, 400, and 500 in FIGS. 2, 4, 5, 8, 10, and 12 may correspond to the deterioration detection device 12 in FIG. 1.

As described above, when a memory operating condition is outside of an allowable operating range of a product, current may be applied to a selected current path, among current paths of a storage and deterioration accumulated in the selected current path may be detected. Thus, an abnormal operation may be rapidly analyzed.

In addition, when a specific condition is satisfied for each of a plurality of degradation factors, current may be applied to a selected current path of a selected storage and deterioration accumulated in the selected current path of the selected storage may be selectively detected. Therefore, a cause of an abnormal operation may be analyzed.

While example embodiments have been shown and described above, it will be apparent to those skilled in the art that modifications and variations could be made without departing from the scope of the present inventive concept as defined by the appended claims.

What is claimed is:

1. A deterioration detection device comprising:
   a storage including a first current path and a second current path to which a current is selectively applied;
   a storage input control circuit configured to compare an internal operating condition of a memory device with a target condition in a first operating mode and to selectively apply the current to one of the first current path and the second current path of the storage based on a result of the comparison; and
   an output circuit configured to output an output signal indicating deterioration, accumulated in one of the first current path and the second current path, in a second operating mode,
   wherein the internal operating condition of the memory device includes an internal temperature of the memory device.

2. The deterioration detection device of claim 1, wherein the storage is a nonvolatile memory.

3. The deterioration detection device of claim 1, wherein the storage includes one of a complementary metal-oxide-semiconductor (CMOS) inverter chain and a fuse.

4. The deterioration detection device of claim 1, wherein the deterioration detection device is configured to operate in the first or second operating mode in response to a first external command.

5. The deterioration detection device of claim 4, wherein the storage input control circuit is configured to select one of the first current path and the second current path in response to a second external command, and
   wherein the output circuit is configured to output the output signal indicated deterioration accumulated in the selected current path.

6. The deterioration detection device of claim 1, wherein the internal operating condition further includes an internal power supply voltage and an internal AC parameter of the memory device, and
   wherein the internal AC parameter includes at least one of a row cycle time (tRC) parameter, a row-to-column address delay (tRCD) parameter, a write recovery time (tWR) parameter, a row precharge time (tRP) parameter and a row-active to row-active delay (tRRD) parameter.

7. A deterioration detection device comprising:
   a mode selector configured to output a mode selection signal setting an operating mode of the deterioration detection device to a first operating mode or a second operating mode, in response to a first external command;
   a comparator configured to receive an internal operating condition of a memory device and a target condition in the first operating mode, and to compare the internal operating condition with the target condition to output a result of the comparison as a first current path selection signal;

a storage including a first current path and a second current path, and configured to selectively apply a current to one current path among the first current path and the second current path response to the first current path selection signal; and a delay detection circuit configured to detect deterioration accumulated in the selected current path, wherein the internal operating condition of the memory device includes an internal temperature of the memory device.

8. The deterioration detection device of claim 7, wherein the mode selector is configured to output a second current path selection signal in response to a second external command, and wherein the delay detection circuit is configured to select the first current path or the second current path in response to the second current path selection signal and to detect the deterioration accumulated in the selected current path.

9. The deterioration detection device of claim 8, wherein the delay detection circuit is configured to determine whether a signal passes through the selected current path for a predetermined time period to detect the deterioration accumulated the selected current path.

10. The deterioration detection device of claim 9, wherein the delay detection circuit is configured to detect the deterioration accumulated in the selected current path as an output signal on an output terminal of the delay detection circuit.

11. The deterioration detection device of claim 7, further comprising:

a first switch configured to control the comparator to receive the internal operating condition in response to the mode selection signal, wherein the internal operating condition further includes an internal power supply voltage and an internal AC parameter of the memory device, and wherein the internal AC parameter includes at least one of a row cycle time (tRC) parameter, a row-to-column address delay (tRCD) parameter a write recovery time (tWR) parameter, a row precharge time (tRP) parameter and a row-active to row-active delay (tRRD) parameter.

12. The deterioration detection device of claim 11, further comprising:

a second switch configured to control the storage to select a current path among the first current path and the second current path of the storage in response to the mode selection signal.

13. The deterioration detection device of claim 12, further comprising:

a third switch configured to control the delay detection circuit to detect the deterioration accumulated in the selected current path of the storage in response to the mode selection signal.

14. A deterioration detection device comprising:

a plurality of storages each including a first current path and a second current path to which a current is applied in a first operating mode;

a plurality of storage input control circuits each configured to select a current path of each of the plurality of storages, to which the current is to be applied, among the first current path and the second current path, in the first operating mode;

a storage output control circuit configured to select a storage among the plurality of storages, and measure deterioration of the selected storage in a second operating mode; and a delay detection circuit configured to detect deterioration accumulated in the current path of the selected storage in the second operating mode, wherein each of the plurality of storage input control circuits is further configured to compare an internal operating condition of memory device with a target condition, and select one of the first current path and the second current path based on a result of the comparison, and wherein the internal operating condition of the memory device includes an internal temperature of the memory device.

15. The deterioration detection device of claim 14, wherein internal operating conditions for the plurality of storage input control circuits are different from each other, wherein the internal operating condition further includes an internal power supply voltage and an internal AC parameter of the memory device, and wherein the internal AC parameter includes at least one of a row cycle time (tRC) parameter, a row-to-column address (tRCD) parameter, a write recovery (tWR) parameter, a row precharge time (tRP) parameter and a row-active to row-active delay (tRRD) parameter.

16. The deterioration detection device of claim 14, wherein each of the plurality of storage input control circuits includes a mode selector configured to set an operating mode of the deterioration detection device to the first operating mode and the second operating mode in response to a first external command.

17. The deterioration detection device of claim 16, wherein each of the mode selectors is configured to enable in response to an enable signal, and wherein each of the storage input control circuits is configured to operate in response to the enabled corresponding mode selector.

18. The deterioration detection device of claim 16, wherein each of the mode selectors is configured to output a second current path selection signal in response to a second external command, and wherein a current path of which deterioration is to be detected, among the first and second current paths of a storage, is selected in response to the second current path selection signal.

19. The deterioration detection device of claim 14, wherein the storage output control circuit comprises:

a multiplexer configured to select a storage of which deterioration is to be detected, among the plurality of storages, in response to a selection signal; and a deterioration factor selector configured to output the selection signal in response to a third external command.

20. The deterioration detection device of claim 19, wherein the delay detection circuit is configured to determine whether a signal passes through a current path of the selected storage for a predetermined time period to detect deterioration accumulated in the current path of the selected storage.

* * * * *